United States Patent
Wennekamp

(10) Patent No.: US 7,622,948 B1
(45) Date of Patent: Nov. 24, 2009

(54) PARALLEL CONFIGURATION OF PROGRAMMABLE DEVICES

(75) Inventor: Wayne Edward Wennekamp, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/136,015

(22) Filed: Jun. 9, 2008

Related U.S. Application Data

(62) Division of application No. 11/378,817, filed on Mar. 17, 2006, now Pat. No. 7,397,272.

(60) Provisional application No. 60/778,002, filed on Feb. 28, 2006.

(51) Int. Cl.
*H03K 19/173* (2006.01)

(52) U.S. Cl. .............................. 326/38; 326/39; 326/40

(58) Field of Classification Search .............. 326/38–41
See application file for complete search history.

(56) References Cited

U.S. PATENT DOCUMENTS

| | | | |
|---|---|---|---|
| 5,640,106 A | 6/1997 | Erickson et al. | |
| 5,760,607 A * | 6/1998 | Leeds et al. | 326/38 |
| 5,789,938 A * | 8/1998 | Erickson et al. | 326/40 |
| 5,794,033 A | 8/1998 | Aldebert et al. | |
| 5,923,614 A * | 7/1999 | Erickson et al. | 365/236 |
| 6,044,025 A * | 3/2000 | Lawman | 365/191 |
| 6,326,806 B1 * | 12/2001 | Fallside et al. | 326/38 |
| 6,614,259 B2 * | 9/2003 | Couts-Martin et al. | 326/40 |
| 6,625,796 B1 | 9/2003 | Rangasayee et al. | |
| 6,714,044 B1 | 3/2004 | Rangan et al. | |
| 6,766,505 B1 | 7/2004 | Rangan et al. | |
| 7,088,132 B1 | 8/2006 | Tang et al. | |
| 7,095,247 B1 | 8/2006 | Tang et al. | |
| 7,265,578 B1 | 9/2007 | Tang et al. | |
| 7,358,762 B1 | 4/2008 | Walstrum et al. | |

OTHER PUBLICATIONS

Altera Corporation, "Configuring multiple Cyclone FPGAs with a single Configuration Device", Cyclone Device Handbook, Section VI., Jul. 2003, pp. 13-1thru 14-30 (88 pages), vol. 1, available from Altera Corporation, 2610 Orchard Parkway, San Jose, California 95134-2020.

Xilinx, Inc., DS123, v2.8, "Platform Flash In-System Programmable Configuration PROMS", Dec. 29, 2005, pp. 1-47, , available from Xilinx, Inc., 2100 Logic Drive, San Jose, CA 95124.

Xilinx, Inc., DS099-2, v1.3, "Spartan-3 FPGA Family Functional Description", Aug. 24, 2004, pp. 1-39, available from Xilinx, Inc., 2100 Logic Drive, San Jose, CA 95124.

(Continued)

*Primary Examiner*—Vibol Tan
(74) *Attorney, Agent, or Firm*—Justin Liu

(57) ABSTRACT

A system for configuring a plurality of programmable devices may include an external memory, a master programmable device, and at least one slave programmable device. The programmable devices may have a parallel data bus connected in a daisy chain fashion. The programmable devices may further include a chip select signal that is also connected in a daisy chain. Special instructions embedded in the configuration bitstream, which may be stored in the external memory, are used by the programmable devices to control the configuration process.

10 Claims, 6 Drawing Sheets

OTHER PUBLICATIONS

U.S. Appl. No. 11/378,817, filed Mar. 17, 2006, Wennekamp, Wayne Edward; entitled Parallel Configuration Of Programmable Devices, Xilinx, Inc. 2100 Logic Drive, San Jose, CA 95124.

U.S. Appl. No. 60/778,002, filed Feb. 28, 2006, Wennekamp, Wayne Edward; entitled Parallel Configuration Of Programmable Devices, Xilinx, Inc. 2100 Logic Drive, San Jose, CA 95124.

* cited by examiner

PARALLEL CONFIGURATION OF PROGRAMMABLE DEVICES

FIELD OF THE INVENTION

The invention relates to configuration of programmable devices, and more particularly, to a parallel configuration of programmable devices.

BACKGROUND OF THE INVENTION

Programmable devices may include, but are not limited to, programmable logic devices (PLDs), which are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional programmable resources with special purposes (e.g., DLLs, RAM, DSP blocks, multipliers, processors, transceivers).

The CLBs, IOBs, interconnect, and other programmable resources are typically programmed by loading a stream of configuration data (bitstream) into internal configuration memory cells that define how the CLBs, IOBs, interconnect, and other blocks are configured. The configuration data can be read from memory (e.g., an external PROM) or written into the FPGA by an external device. The collective states of the individual memory cells then determine the function of the FPGA.

Another type of PLD is the complex programmable logic device (CPLD). A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In some CPLDs, configuration data is stored on-chip in non-volatile memory, then downloaded to volatile memory as part of an initial configuration sequence.

For all of these programmable logic devices (PLDs), the functionality of the device is controlled by data bits (configuration data or bitstream) provided to the device for that purpose. The data bits can be stored in volatile memory (e.g., static RAM cells, as in FPGAs and some CPLDs), in non-volatile memory (e.g., flash memory, as in some CPLDs), or in any other type of memory cell.

In particular, some programmable devices, including many FPGAs, have internal volatile memory (e.g., SRAM configuration memory) for storing the configuration data or bitstream during operation of the FPGA. Since the internal volatile memory does not retain data when power is not supplied to the device, such programmable devices typically have an external device for providing the bitstream at power up or on reset conditions. The external device may be an external tester/programmer, such as a computer or test fixture, or an external nonvolatile memory, such as a flash or EEPROM memory.

Prior techniques for configuring a programmable device, such as n FPGA, have used a serial interface to the external device. For example, serial memories may be popular because they have a very compact interface with a small number of pins. However, a memory having a parallel interface may offer significant speed increases that allow a programmable device to be configured in a short amount of time. Parallel memories may also be more economical and may be available in larger sizes than their serial counterparts. Prior parallel techniques have had certain constraints, such as board layout constraints or timing constraints, that have limited their appeal.

Therefore, it would be desirable to address these and other needs in programmable devices.

SUMMARY OF THE INVENTION

In accordance with embodiments of the present invention, a system for configuring a plurality of programmable devices may include a parallel memory, a master programmable device, and a slave programmable device. The parallel memory may store a configuration bitstream and may have a parallel data output. The master programmable device may have a parallel data input, a parallel data output, and a chip select output. The parallel data output of the parallel memory may be coupled to the parallel data input of the master programmable device. The slave programmable device may have a parallel data input and a chip select input. The parallel data output of the master programmable device may be coupled to the parallel data input of the slave programmable device, and the chip select output of the master programmable device may be coupled to the chip select input of the slave programmable device. The master programmable device may provide addresses to the parallel memory. The parallel memory may provide the configuration bitstream in parallel to the master programmable device in response to the addresses. The master programmable device provides at least a portion of the configuration bitstream in parallel to the slave programmable device.

In accordance with embodiments of the present invention, a method for configuring a first programmable device in a chain of programmable devices may include receiving a bitstream at a parallel data input; receiving an instruction to enable a parallel output register, where the instruction includes a count; enabling a parallel output register in response to receiving the instruction; passing the bitstream received at the parallel data input through to a parallel data output via the parallel output register; counting the number of bytes passed to the parallel data output; and monitoring the bitstream after reaching the count in the instruction.

In accordance with embodiments of the present invention, a master programmable device, for use in a chain of programmable devices including the master programmable device and a slave programmable device, may include a parallel data input port, a parallel data output port, at least one register coupled between the parallel data input port and the parallel data output port, a chip select output port, and configuration control circuitry coupled to the at least one register. The configuration control circuitry may enable the at least one register in response to receiving an enable parallel data output instruction at the parallel data input port.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems having programmable or configurable devices, such as programmable logic devices or integrated circuits having some programmable resources. The present invention has been found to be particularly applicable and beneficial for systems including a plurality of programmable logic devices and an external memory for storing configuration data. While the present invention is not so limited, an appreciation of the present invention is presented by way of specific examples, such as a plurality of field programmable gate arrays (FPGAs) having an external nonvolatile memory for storing configuration data.

In the following description, numerous specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

Figure 1:
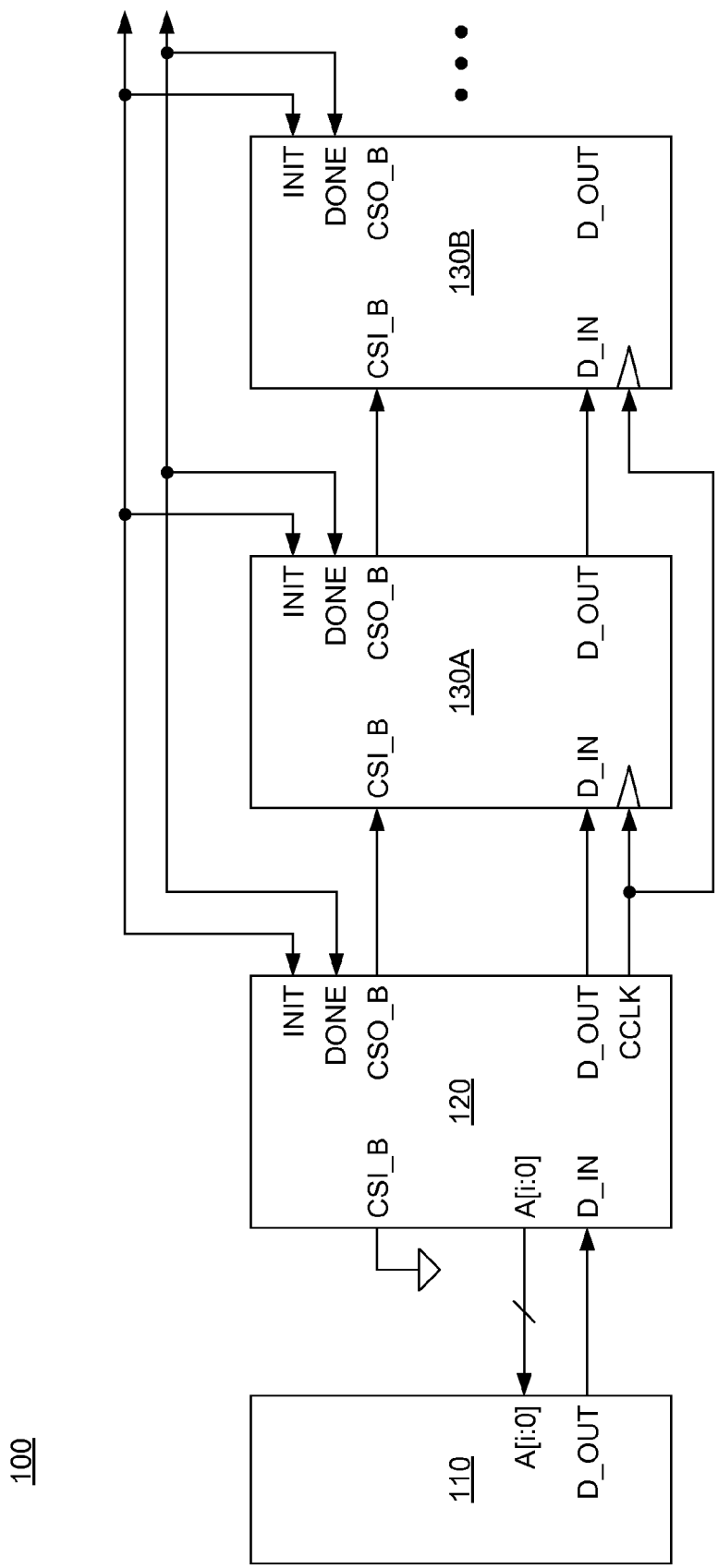
FIG. 1 shows a system for configuring programmable devices using a serial daisy chain.

FIG. 1 shows a system 100 for configuring programmable devices 120 and 130 using a serial daisy chain. System 100 may include an external storage or memory device 110 for storing configuration data for configuring programmable devices 120 and 130. Programmable devices 120 and 130 may be programmable logic devices (PLDs) such as a field programmable gate array (FPGA). As shown in FIG. 1, programmable device 120 may be designated a master device and programmable devices 130 may be designated slave device. External memory device 110 may be a serial nonvolatile memory.

In system 100, master device 120 may provide address signals to memory 110. In response, memory 110 will provide a serial data stream from its D_OUT output to the D_IN input of master device 120. Master device 120 is coupled to slave devices 130A and 130B in a serial chain. That is, a serial D_OUT output of master device 120 is connected to a D_IN serial input of slave device 130A. Further slave devices can be further chained in a similar manner. A chip select input CSI_B, which may be active low, of master device 120 may be coupled to ground. The chip select signal may also be chained from a chip select output CSO_B of master device 120 to a chip select input CSI_B of slave device 130A. Other slave devices may also be chained together. Master device 120 also provides a configuration clock CCLK signal to all slave devices for controlling timing of the configuration process. For example, data on the D_OUT/D_IN chain may be aligned to an edge of configuration clock CCLK. Finally, other control signals, such as an initialization signal INIT and a done signal DONE may be coupled together to reset programmable devices 120 and 130, and to indicate that configuration is complete. Note that in some embodiments, a master device may provide only a clock signal to a memory device, and the memory device may have other means for generating address, as is well known to those of skill in the art. For example, the Platform Flash PROM available from Xilinx, Inc., includes an internal address counter, as described in greater detail in the "Platform Flash In-System Programmable Configuration PROMS," DS123 (v2.8), pages 10-13, dated Dec. 29, 2005, available from Xilinx, Inc.

As noted above, one advantage of a serial interface is that it is very compact and only uses a small number of pins. However, drawbacks to a serial daisy chain are that it can be very slow, since data is transmitted serially. In addition, serial memories may have cost or efficiency disadvantages. In some alternative systems, the data bus between memory 110 and master device 120 may be a parallel data bus. That is, the D_OUT output of memory 110 and the D_IN input of master device 120 may be a parallel, for example byte wide, bus. This allows for the use of a parallel memory 110. However, in such implementations, the data must first be serialized in master device 120 before it is sent to slave devices 130, negating any performance benefits of a parallel memory device.

Figure 2:
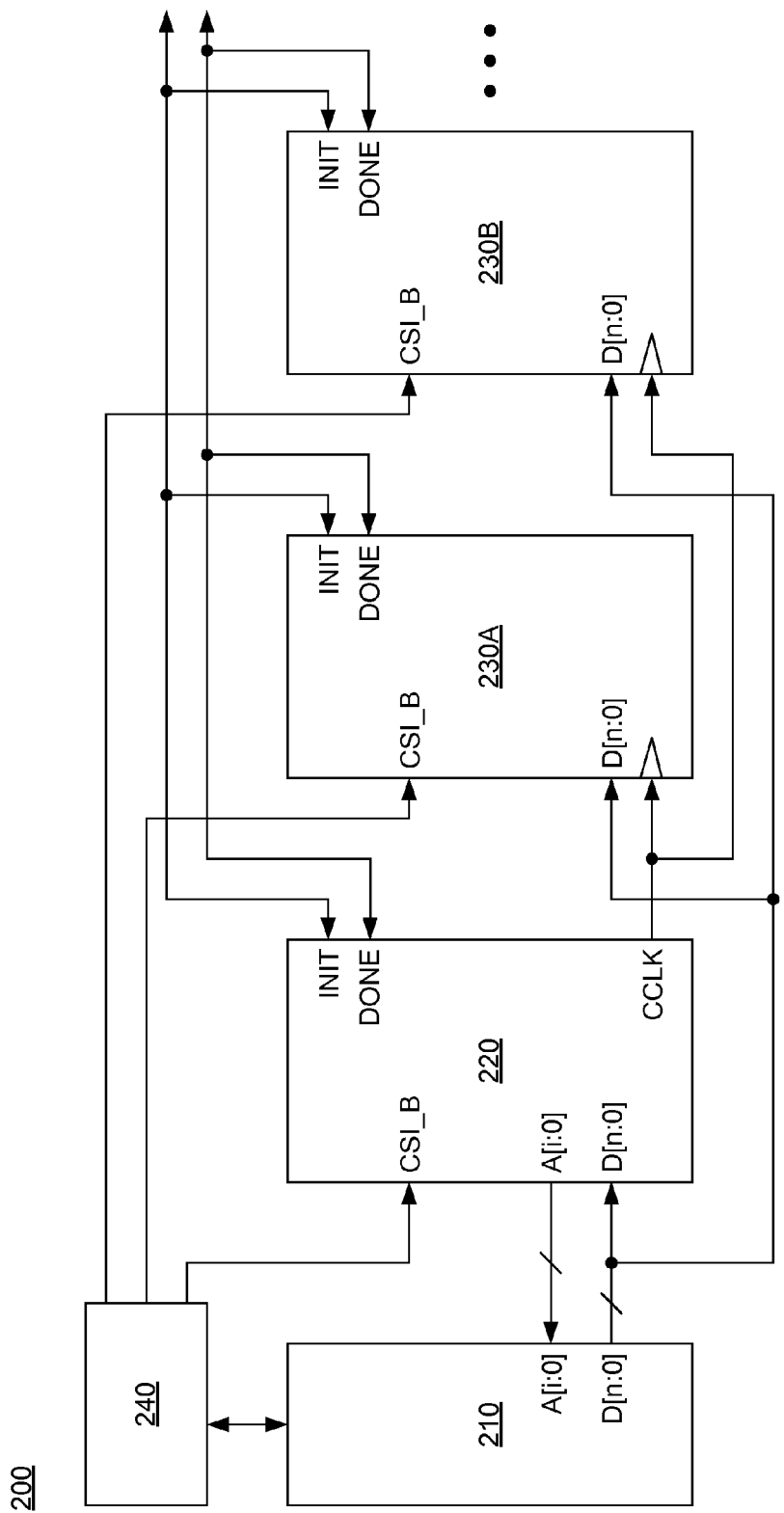
FIG. 2 shows a system for configuring programmable devices using a shared parallel bus.

FIG. 2 shows a system 200 for configuring programmable devices 220 and 230 using a shared parallel bus. Programmable devices 220 and 230 may be similar to programmable devices 120 and 130 of FIG. 1, except that they each have a parallel data input D[n:0]. For example, n may be equal to 7 for a byte wide data path. In particular, a shared data bus is coupled to each of the D[n:0] inputs of the programmable devices 220 and 230. External memory 210 provides parallel data at its D[n:0] output. A control circuit 240 may be used to control the configuration process. In some embodiments, control circuit 240 may be implemented in another programmable device, such as an FPGA or CPLD. In particular, control device 240 is coupled to the chip select input CSI_B of each of the programmable devices 220 and 230, enabling each one in turn when the data targeted to that device is on the shared data bus. In system 200, each programmable device 220 and 230 receives parallel configuration data, which means that configuration time is significantly shorter as compared to the serial daisy chain of system 100 of FIG. 1. However, a shared parallel data bus has significant drawbacks. Since the parallel data bus must be routed to each programmable device, significant board routing resources may be consumed. Also, the long wires required may degrade signal quality, or limit the maximum configuration clock CCLK frequency.

Figure 3:
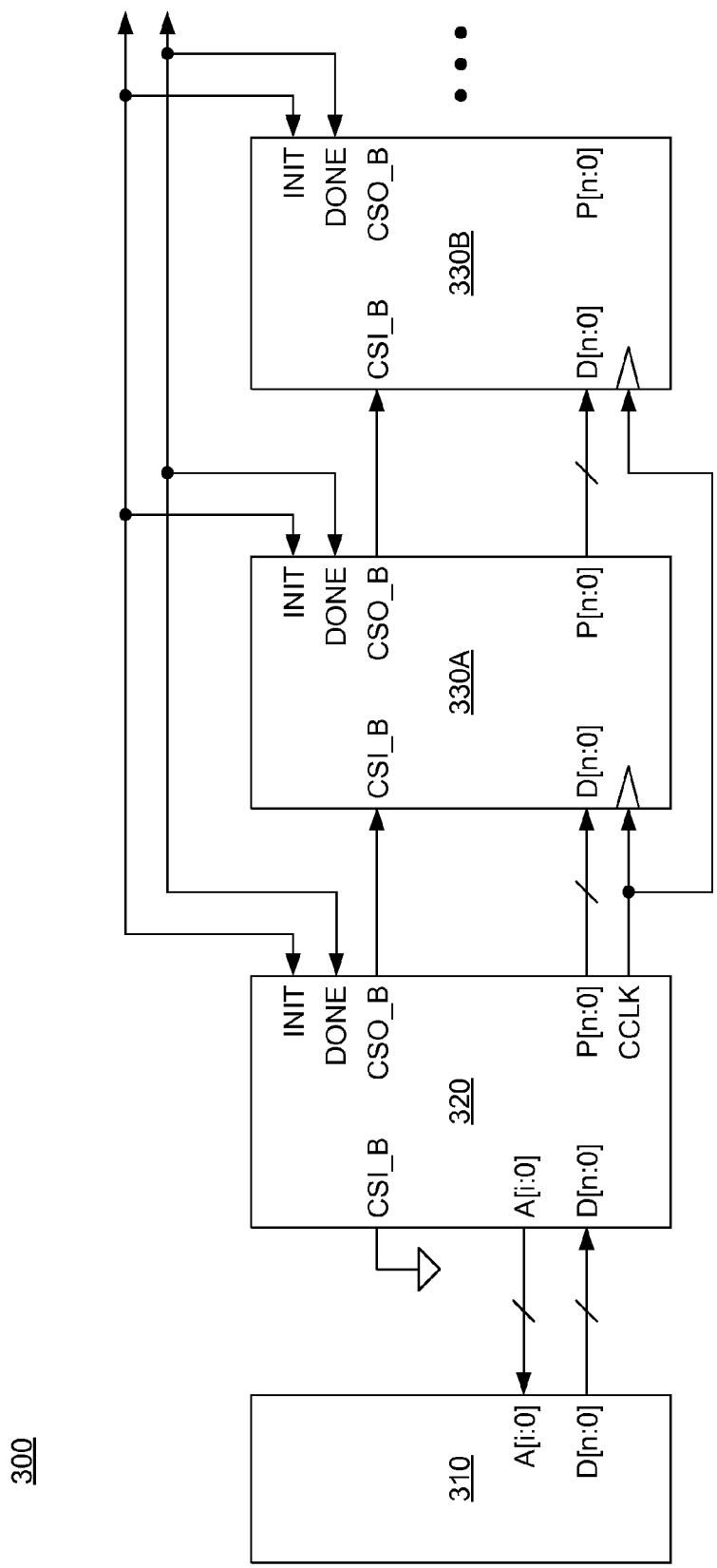
FIG. 3 shows a system for configuring programmable devices using a parallel daisy chain in accordance with embodiments of the present invention.

FIG. 3 shows a system 300 for configuring programmable devices 320 and 330 using a parallel daisy chain in accordance with embodiments of the present invention. In some embodiments, programmable devices 320 and 330 may be programmable logic devices such as a field programmable gate array (FPGA). Examples of FPGAs may include the Virtex-II, Virtex-4, and Spartan 3 families of FPGAs available from Xilinx, Inc. Programmable devices 320 and 330 may be the same type of device, or may be a combination of various types of devices. In some embodiments, external storage device 310 may be a nonvolatile memory, for example flash memory or an EEPROM. Such memories may be available from any of a number of suppliers including Advanced Micro Devices Inc., Atmel Corp., Micron Technology Inc., and Intel Corp.

Programmable devices 320 and 330 may include one or more mode pins (not shown) and/or other control pins. The mode pins may be used, for example, to determine the configuration or programming mode for the programmable device. Programming modes may include master serial, slave serial, master SelectMAP, slave SelectMAP, and JTAG. Some methods for configuring an FPGA may be described in greater detail in the "Spartan-3 FPGA Family: Functional Description," DS099-2 (v1.3), pages 32-39, dated Aug. 24, 2004, available from Xilinx, Inc.

As shown in FIG. 3, programmable device 320 may be designated a master device (e.g., by using its mode pins) and may include a configuration mode for communicating with external memory 310. As shown, external memory 310 is a parallel memory that receives addresses from master device 320 and provides parallel data from its D[n:0] output to the D[n:0] input of master device 320. In some embodiments, n may be equal to 7 for a byte wide interface, although other widths may also be used. Memory 310 may store configuration data, or a configuration bitstream, for configuring the plurality of programmable devices 320 and 330. In some embodiments, more than one memory device may be used.

Master device 320 has a parallel data output P[n:0] for providing parallel data output to a slave device 330A. In particular, parallel data output P[n:0] of master device 320 may be coupled to the parallel data input D[n:0] of slave device 330A in a serial chain. A parallel data output P[n:0] of slave device 330A may further be coupled to the parallel data input D[n:0] of slave device 330B. Other slave devices may be similarly coupled together in a parallel daisy chain. As in FIG. 1, the chip select control signal may also be connected in a daisy chain. That is, a chip select output (which may be active low) CSO_B of master device 320 may be coupled to the chip select input CSI_B of slave device 330A. Similarly, the chip select output CSO_B of slave device 330A may be coupled to the chip select input CSI_B of slave device 330B. The chip select input CSI_B of master device 320 may be coupled to ground to enable master device 320. Slave devices 330 may then be enabled in turn through the chip select daisy chain when data targeted for each slave device is available at its D[n:0] input. The initialization signal INIT and the configuration complete signal DONE of each programmable device may be coupled together. In some instances, pullups or pulldowns, as appropriate, may be coupled to those control signals to provide a default value. Finally, master device 320 may provide a configuration clock CCLK to the slave devices 330 to control timing of the configuration process.

Thus, in system 300, programmable devices 320 and 330 are coupled together in a parallel daisy chain. This allows for the use of a parallel memory device 310, which may offer costs savings. This also allows for parallel configuration of all devices, which advantageously allows for faster configuration over prior serial techniques. Finally, since each device is only chained to at most two other devices, there is minimal impact on board routing resources. In particular, only short wires are needed to move data from one device to the next device in the chain. In some embodiments, the pins used during configuration (e.g., D[n:], P[n:0]) may be available as general purpose I/Os after the configuration process is complete. That is, once all of the devices have been configured, the I/O pins used to implement the configuration interface may be used for other purposes. The only constraint in using these pins for other purposes is the pre-existing board routing. In implementations including field programmable gate arrays, however, this constraint is commonly not limiting due to the general programmability of FPGAs.

Figure 4:
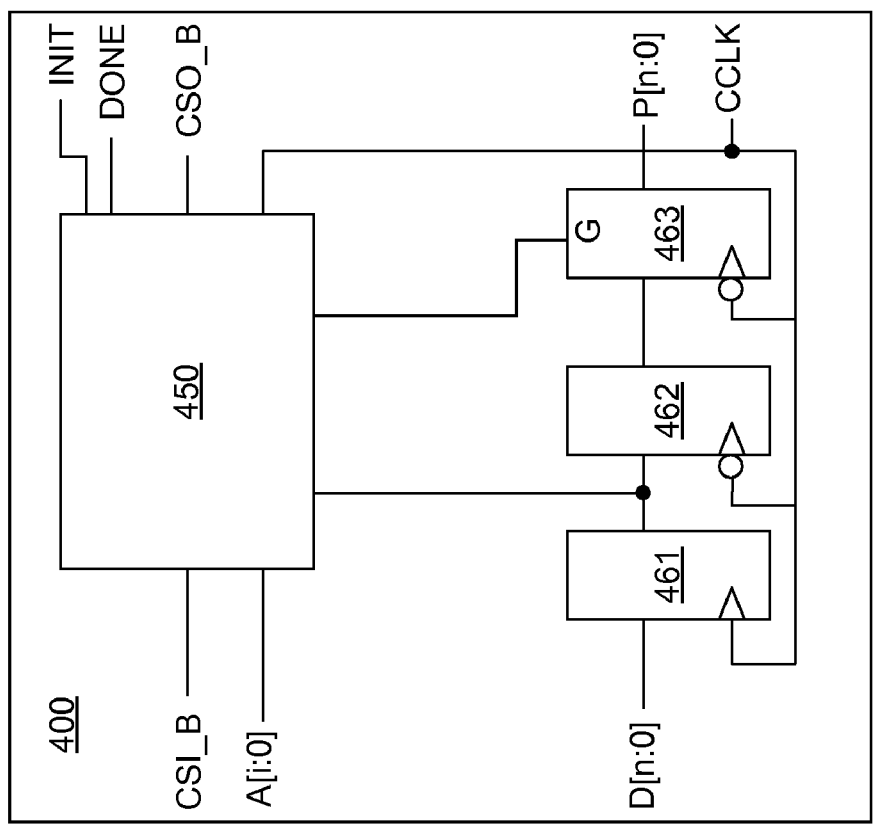
FIG. 4 shows a programmable device in accordance with embodiments of the present invention.

FIG. 4 shows a programmable device 400 in accordance with embodiments of the present invention. In some embodiments, programmable device 400 may be used, for example, as master device 320 or slave device 330. Programmable device 450 includes configuration control circuitry 450 and registers 461-463. In general, configuration control circuitry 450 controls the configuration process for device 400. If device 400 is identified or designated as a master device, configuration control circuitry 450 may provide addresses for addressing the external memory though address port A[i:0]. Configuration control circuitry 450 may also provide the configuration clock signal CCLK. In both master and slave devices, control circuitry 450 may receive and provide the initialization signal INIT and the configuration complete signal DONE. Finally, configuration control circuitry 450 may receive instructions and control data registers 461-463, and control daisy chaining of the chip select bits and/or the parallel configuration data.

In general, device 400 may receive a bitstream through data input port D[n:0]. One or more registers (such as registers 461 and 462) may be used to capture the bitstream. The bitstream may include certain instruction words that may be used by configuration control, circuit 450. Furthermore, device 400 may receive an chip select signal at its CSI_B input to indicate that it should monitor the input data. If device 400 is a master device, it may provide addresses to an external memory and receive data from that memory. If device 400 is a slave device, it may receive data from the previous device in the chain.

Certain instructions may indicate that device 400 should enable its POUT register 463, which provides data to the P[n:0] output. This instruction may also include a count indicating a number of bits or bytes. This enable POUT instruction means that the data being received is not targeted for the current device, and is instead targeted to a downstream device. By enabling POUT register 463, the input data is passed through to the next device in the chain. The count may indicate the number of bytes that the current device should ignore. That is, the count indicates the length of the data that is targeted to downstream devices. Such instructions can be nested in the bitstream to enable multiple devices to ignore the bitstream data and to target a particular device in the chain. The instruction may also be used by configuration control circuit 450 to control the chip select output signal CSO_B that is passed on to downstream devices. That is, when POUT register 463 is enabled, the CSO_B output may also be enabled to indicate to the downstream device that it should start monitoring the bitstream for instructions and/or data. Notably, by properly arranging the bitstream, a user may enforce the order in which devices in the chain are configured. Also, in some embodiments, when POUT register 463 is not enabled, the outputs P[n:0] may be tri-stated with weak pullups (or pulldowns) to prevent floating inputs. In such cases, the CSO_B output may also be tri-stated with a weak pullup to prevent a floating input. Note that more or fewer registers 461-463 may be used depending on the timing requirements of the system, and each register may be clocked by a rising or falling edge as needed. In some embodiments, the bitstream will include one or more dummy bytes at the beginning to flush registers 461-463, or configuration control circuitry 450 may insert dummy bytes to flush downstream registers.

Figure 5:
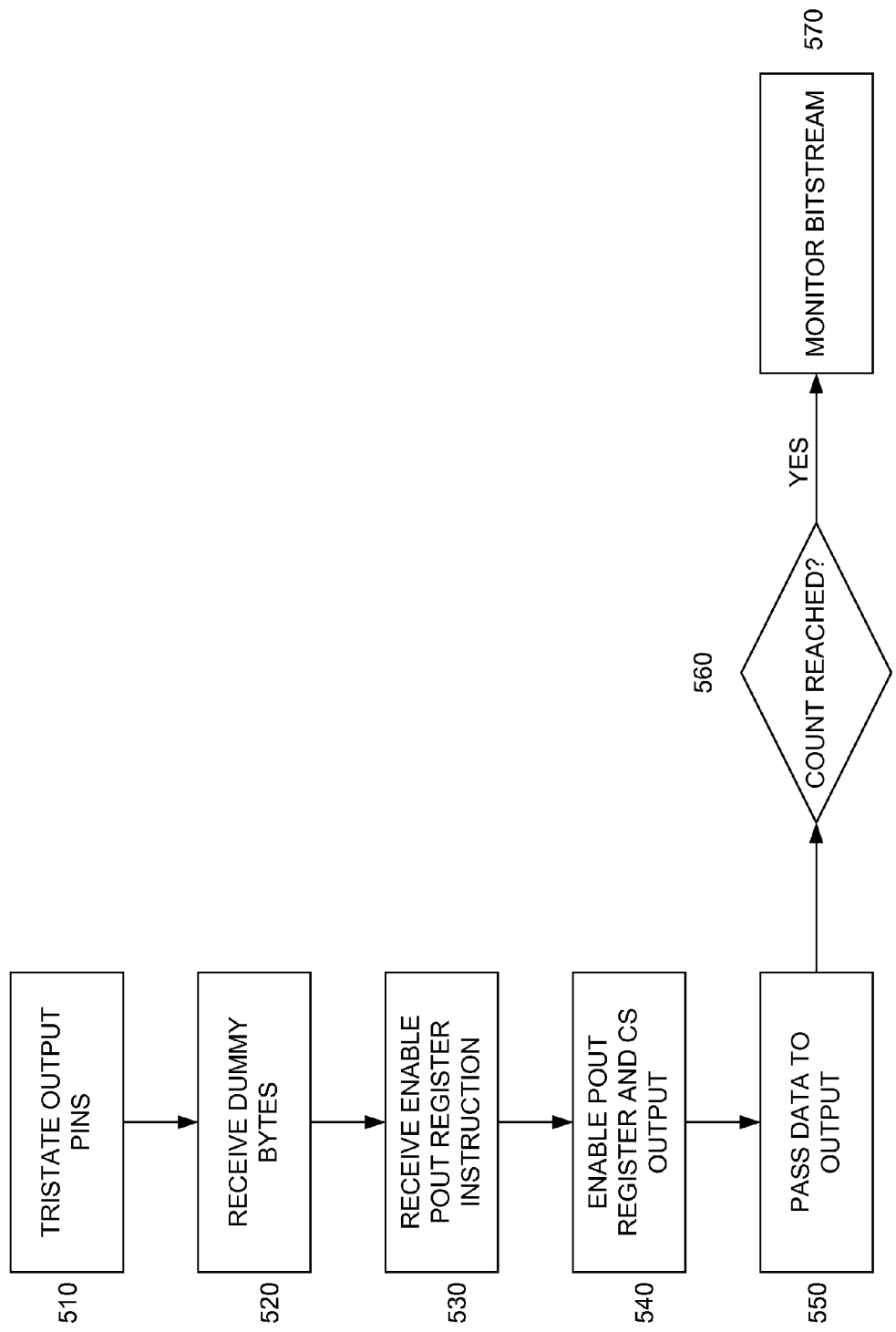
FIG. 5 shows a flow diagram for configuring programmable devices in accordance with embodiments of the present invention.

FIG. 5 shows a flow diagram for configuring programmable devices, such as programmable devices 320, 330, or 400, in accordance with embodiments of the present invention. Initially, output pins such as the chip select output and the parallel data output may be tri-stated with weak pullups (or pulldowns) in step 510. One or more dummy bytes may be received to flush registers in step 520. The device being configured may receive an instruction to enable its parallel output register (POUT) in step 530. In response to the instruction, the device may enable its POUT register, and may also enable its chip select output in step 540. The instruction may also include a count. In step 550, data received at a parallel data input may be passed to its parallel data output via the POUT register. As noted above, one or more dummy bytes may also be inserted. This data may be targeted for downstream devices. In step 560, the number of bytes being passed on is counted until the count received has been reached. Once the count has been reached, indicating that no more downstream information is being received, the current device begins to monitor the bitstream again in step 570. Some or all of these steps may be repeated depending on the contents of the bitstream and the particular application. Some of the steps may also be optional or skipped in some embodiments.

Figure 6:
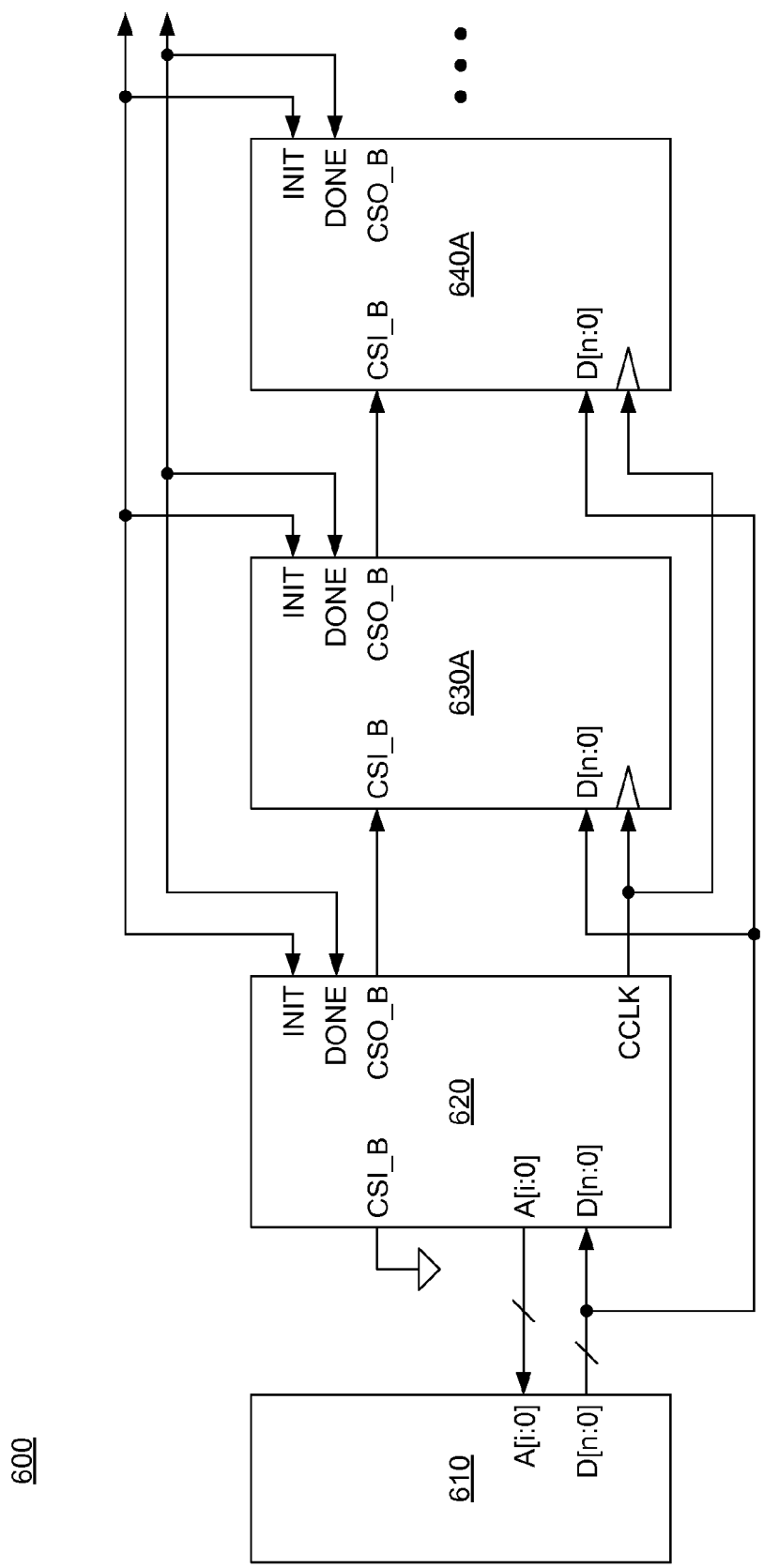
FIG. 6 shows a system for configuring programmable devices using a parallel interface in accordance with embodiments of the present invention.

FIG. 6 shows a system 600 for configuring programmable devices 620 and 630 using a parallel interface in accordance with embodiments of the present invention. In system 600, programmable devices 620 and 630 are coupled together with a shared data bus. That is, the data output from memory device 610 is coupled to the data input port D[n:0] of each of devices 620 and 630. The chip select signals are still connected in a daisy chain fashion, similar to system 300. In such embodiments, the daisy chaining features described above may be used independently of the parallel data daisy chain.

Those having ordinary skill in the relevant arts of the invention will now perceive various modifications and additions that can be made as a result of the disclosure herein. For example, the above text describes the circuits and methods of the invention in the context of integrated circuits such as field programmable gate arrays. However, embodiments in accordance with the invention can also be implemented in other systems including other types of devices that may be partially or fully configurable. Further, circuits and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A method for configuring a first programmable device in a chain of programmable devices, the method comprising:
   receiving a bitstream at a parallel data input of the first programmable device;
   receiving an instruction to enable a parallel output register of the first programmable device, the instruction including a count;
   enabling a parallel output register of the first programmable device in response to receiving the instruction;
   passing the bitstream received at the parallel data input through to a parallel data output of the first programmable device via the parallel output register;
   counting the number of bytes passed to the parallel data output; and
   monitoring the bitstream after reaching the count in the instruction.

2. The method of claim 1, further comprising enabling a chip select output in response to receiving the instruction.

3. The method of claim 2, further comprising tri-stating at least one of the parallel data output and the chip select output.

4. The method of claim 1, further comprising providing at least one dummy byte at the parallel data output.

5. The method of claim 1, wherein the first programmable device is a field programmable gate array.

6. A master programmable device for use in a chain of programmable devices comprising the master programmable device and a slave programmable device, the master programmable device comprising:
   a parallel data input port;
   a parallel data output port;
   at least one register coupled between the parallel data input port and the parallel data output port;
   a chip select output port; and
   configuration control circuitry coupled to the at least one register;
   wherein the configuration control circuitry enables the at least one register in response to receiving an enable parallel data output instruction at the parallel data input port.

7. The master programmable device of claim 6, further comprising:
   a chip select output port coupled to the configuration control circuitry for selecting a downstream device in the chain of programmable devices;
   wherein the configuration control circuitry asserts a chip select output signal at the chip select output port in response to receiving the enable parallel data output instruction.

8. The master programmable device of claim 6, wherein the configuration control circuitry provides a configuration clock coupled to the at least one register.

9. The master programmable device of claim 6, further comprising:
   an address port coupled to the configuration control circuitry for providing addresses to an external memory.

10. The master programmable device of claim 6, wherein the master programmable device is a field programmable gate array.

* * * * *